US010396721B2

(12) United States Patent
Komatsuzaki et al.

(10) Patent No.: US 10,396,721 B2
(45) Date of Patent: Aug. 27, 2019

(54) DISTORTION COMPENSATION CIRCUIT

(71) Applicant: Mitsubishi Electric Corporation, Tokyo (JP)

(72) Inventors: Yuji Komatsuzaki, Tokyo (JP); Yuichi Fujimoto, Tokyo (JP); Jun Nishihara, Tokyo (JP); Kazuhiro Iyomasa, Tokyo (JP); Koji Yamanaka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/762,300

(22) PCT Filed: Nov. 18, 2015

(86) PCT No.: PCT/JP2015/082393
§ 371 (c)(1),
(2) Date: Mar. 22, 2018

(87) PCT Pub. No.: WO2017/085807
PCT Pub. Date: May 26, 2017

(65) Prior Publication Data

US 2018/0316317 A1 Nov. 1, 2018

(51) Int. Cl.

*H03F 1/32* (2006.01)
*H03F 3/19* (2006.01)
*H03H 7/01* (2006.01)
*H03H 7/19* (2006.01)
*H03H 7/20* (2006.01)

(52) U.S. Cl.

CPC ................ *H03F 1/32* (2013.01); *H03F 3/19* (2013.01); *H03F 2200/165* (2013.01); *H03F 2200/255* (2013.01); *H03F 2200/267* (2013.01); *H03H 7/0115* (2013.01); *H03H 7/19* (2013.01); *H03H 7/20* (2013.01)

(58) Field of Classification Search

CPC ........................................................ H03F 1/32
See application file for complete search history.

(56) References Cited

U.S. PATENT DOCUMENTS 7,680,467 B2 * 3/2010 Ishigami ............... H03F 1/3223 330/136
2011/0081873 A1 4/2011 Akasegawa

FOREIGN PATENT DOCUMENTS

JP 9-312535 A 12/1997
JP 11-145710 A 5/1999
(Continued)

OTHER PUBLICATIONS

International Search Report issued in PCT/JP2015/082393 (PCT/ISA/210), dated Dec. 28, 2015.

*Primary Examiner* — Hai L Nguyen
(74) *Attorney, Agent, or Firm* — Birch, Stewart, Kolasch & Birch, LLP

(57) ABSTRACT

A distributor distributes an input signal to a first transmission line and a second transmission line. A high-pass filter, a first linearizer, and a first phase shifter disposed on the first transmission line adjust the phase and amplitude of an intermodulation distortion in a low-frequency range. A low-pass filter, a second linearizer, and a second phase shifter disposed on the second transmission line adjust the phase and amplitude of an intermodulation distortion in a high-frequency range. A synthesizer synthesizes the signal from the first transmission line and the signal from the second transmission line.

6 Claims, 5 Drawing Sheets

(56) References Cited

FOREIGN PATENT DOCUMENTS

| | | | |
|---|---|---|---|
| JP | 11-355055 | A | 12/1999 |
| JP | 2000-101303 | A | 4/2000 |
| JP | 2001-244752 | A | 9/2001 |
| JP | 2002-135063 | A | 5/2002 |
| JP | 2004-15390 | A | 1/2004 |
| JP | 2004-350110 | A | 12/2004 |
| JP | 2006-203271 | A | 8/2006 |
| JP | 2011-97552 | A | 5/2011 |
| JP | 2015-173306 | A | 10/2015 |

* cited by examiner

DISTORTION COMPENSATION CIRCUIT

TECHNICAL FIELD

The present invention relates to a distortion compensation circuit that is disposed at an input side or an output side of a high-frequency amplifier. The circuit enables the phase and amplitude in intermodulation distortion in a low frequency range and those in a high frequency range to be adjusted with respect to a desired wave and thereby compensates the asymmetrical intermodulation distortion generated in the amplifier.

BACKGROUND ART

As a conventional method for reducing intermodulation distortion generated in an amplifier or the like, a circuit including a distortion compensation circuit in the preceding or subsequent stage of the amplifier is considered. Such a distortion compensation circuit generates a specific intermodulation distortion having an amplitude whose power ratio to the desired wave is the same as that of the intermodulation distortion generated at the amplifier and having a relative phase shifted by 180 degrees with respect to the desired wave, thereby reducing the intermodulation distortion generated at the amplifier.

Conventionally, as an example of such a distortion compensation circuit, there is a circuit including an impedance transformation circuit disposed in at least one of the preceding stage and the subsequent stage of a distortion generating circuit. The impedance transformation circuit allows waves in a desired frequency band to pass through and varies the impedance in a frequency band corresponding to the difference in the frequencies of two desired waves (see, for example, Patent Literature 1).

CITATION LIST

Patent Literature

Patent literature 1: Japanese Unexamined Patent Application Publication No. 2004-15390

SUMMARY OF INVENTION

Technical Problem

However, in a case where the frequency band of the desired wave is broad, differences in phase and amplitude are generated in intermodulation distortion which appears in a range lower than that of the desired waves (IM3L) and intermodulation distortion which appears in a range higher than that of the desired waves (IM3H) in the amplifier, resulting in asymmetrical characteristics. In such a case, the conventional distortion compensation circuit disclosed in Patent Literature 1 cannot adjust the phase and amplitude in the intermodulation distortion IM3L and those in IM3H individually, and thus there is a problem that the asymmetrical intermodulation distortion in the amplifier cannot accurately compensated.

The present invention has been made to solve the above problem, and an object thereof is to provide a distortion compensation circuit that can accurately compensate the asymmetrical intermodulation distortion generated in an amplifier.

Solution to Problem

The distortion compensation circuit according to the present invention includes: a distributor distributing an input signal to a first transmission line and a second transmission line; a high-pass filter disposed on the first transmission line, having characteristics to attenuate, among input high-frequency signals being two waves, an amplitude of a signal in a low-frequency range by a set value or more with respect to an amplitude of a signal in a high-frequency range; a first linearizer connected to the high-pass filter; a first phase shifter connected to the first linearizer; a low-pass filter disposed on the second transmission line, having characteristics to attenuate, among the input high-frequency signals being two waves, an amplitude of a signal in a high-frequency range by a set value or more with respect to an amplitude of a signal in a low-frequency range; a second linearizer connected to the low-pass filter; a second phase shifter connected to the second linearizer; and a synthesizer synthesizing a signal from the first transmission line passed through the high-pass filter, the first linearizer, and the first phase shifter and a signal from the second transmission line passed through the low-pass filter, the second linearizer, and the second phase shifter.

Advantageous Effects of Invention

According to the present invention, a distortion compensation circuit can adjust the phase and amplitude of the intermodulation distortion in the low frequency range and those in the high frequency range with respect to a desired wave, respectively, so that the asymmetrical intermodulation distortion generated in an amplifier can be accurately compensated.

DESCRIPTION OF EMBODIMENTS

Some embodiments of the present invention will now be described in more detail with reference to the accompanying drawings.

Embodiment 1

Figure 1:
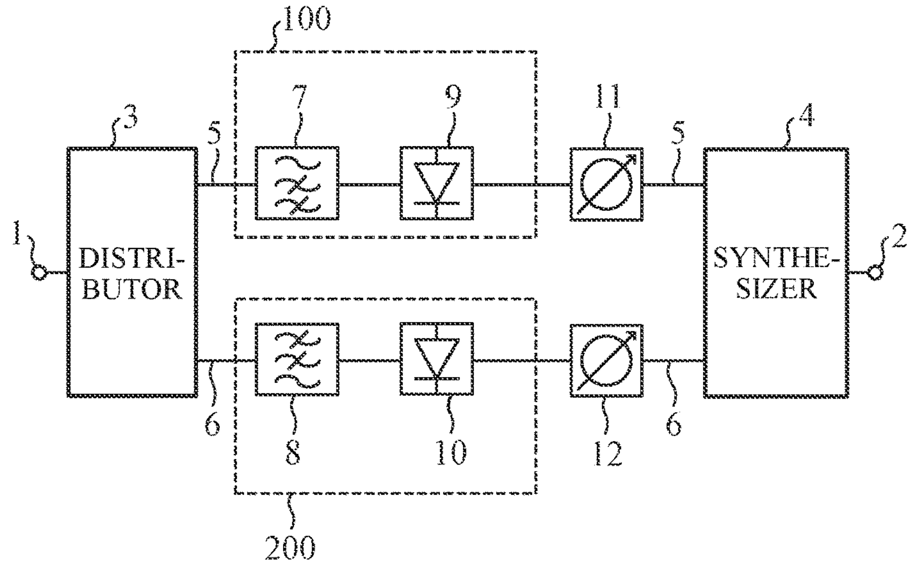
FIG. 1 is a configuration diagram illustrating a distortion compensation circuit according to Embodiment 1 of the present invention.

FIG. 1 is a block diagram illustrating a distortion compensation circuit according to the present embodiment.

The distortion compensation circuit of the present embodiment includes an input terminal 1, an output terminal 2, a distributor 3, a synthesizer 4, a first transmission line 5, a second transmission line 6, a high-pass filter 7, a low-pass filter 8, a first linearizer 9, a second linearizer 10, a first phase shifter 11, and a second phase shifter 12, as illustrated.

The input and output terminals 1 and 2 are terminals of a distortion compensation circuit for inputting and outputting signals, respectively. The distributor 3 distributes a signal input from the input terminal 1 to two systems, i.e., the first transmission line 5 and the second transmission line 6. The synthesizer 4 synthesizes the signals from the two systems, i.e., the first and second transmission lines 5 and 6 and then outputs the synthesized signal from the output terminal 2. The high-pass filter 7 is disposed on the first transmission line 5 and allows signals in a high-frequency range to pass through with less loss than signals in a low-frequency range. The low-pass filter 8 is disposed on the second transmission line 6 and allows signals in the low-frequency range to pass through with less loss than signals in the high-frequency range. The first linearizer 9 is a circuit for performing distortion compensation and is disposed in the subsequent stage of the high-pass filter 7. The second linearizer 10 is a circuit for performing distortion compensation and is disposed in the subsequent stage of the low-pass filter 8. The high-pass filter 7 and the first linearizer 9 compose a first adjustment circuit 100 adjusting the amplitude of the intermodulation distortion in the low-frequency range, and the low-pass filter 8 and the second linearizer 10 compose a second adjustment circuit 200 adjusting the amplitude of the intermodulation distortion in the high-frequency range.

The first and second phase shifters 11 and 12 control the phases of the signals from the first and second linearizers 9 and 10, respectively. The synthesizer 4 synthesizes the signals from the first and second phase shifters 11 and 12 and then outputs the synthesized signal from the output terminal 2.

The components mentioned above will now be described in detail.

Figure 2:
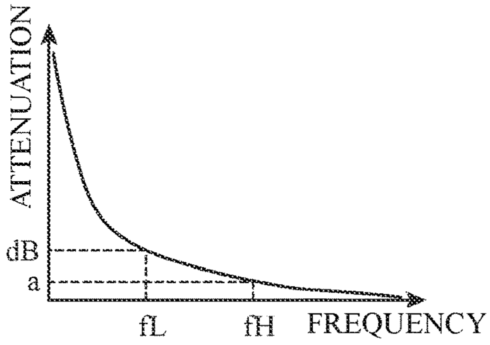
FIG. 2 is a chart for explanation illustrating frequency characteristics of a high-pass filter in the distortion compensation circuit according to Embodiment 1 of the invention.
Figure 3:
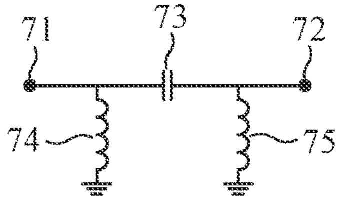
FIG. 3 illustrates a configuration of the high-pass filter in the distortion compensation circuit according to Embodiment 1 of the invention.

The high-pass filter 7 has characteristics in which, among the two wave high-frequency signals, being input desired waves (hereinafter referred to as RF signals), the amplitude of a wave in a low range frequency fL is attenuated by 6 dB or more with respect to that of a wave in a high range frequency fH. FIG. 2 shows the frequency characteristics. Any characteristics may be allowed in regions outside the frequency band. The magnitude of attenuation is not limited to the value 6 dB. The high-pass filter 7 can be realized, for example, by the configuration of the circuit illustrated in FIG. 3. The circuit includes an input terminal 71, an output terminal 72, a capacitor 73, and inductors 74 and 75. It should be noted that any other circuit configuration may also be used, if it has the frequency characteristics illustrated in FIG. 2, even if any differences exist in the number of stages, in the use of a distributed constant line, or the like.

Figure 4:
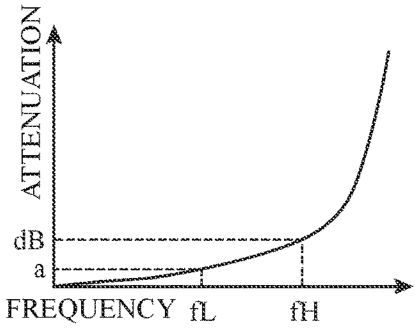
FIG. 4 is a chart illustrating frequency characteristics of a low-pass filter in the distortion compensation circuit according to Embodiment 1 of the invention.
Figure 5:
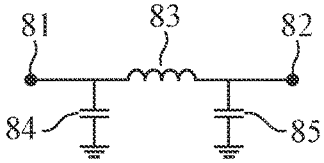
FIG. 5 illustrates a configuration of the low-pass filter in the distortion compensation circuit according to Embodiment 1 of the invention.

The low-pass filter 8 has characteristics in which, among the input two waves of RF signals, the amplitude of the wave in the high range frequency fH is attenuated by 6 dB or more with respect to that of the wave in the low range frequency fL. FIG. 4 illustrates the frequency characteristics. Any characteristics may be allowed in regions outside the frequency band. The magnitude of attenuation is not limited to the value 6 dB. The low-pass filter 8 can be realized, for example, by the configuration of the circuit illustrated in FIG. 5. The circuit includes an input terminal 81, an output terminal 82, an inductor 83, and capacitors 84 and 85. It should be noted that any other circuit configuration may also be used, if it has the frequency characteristics illustrated in FIG. 4, even if any differences exist in the number of stages, in the use of a distributed constant line, or the like.

Figure 6:
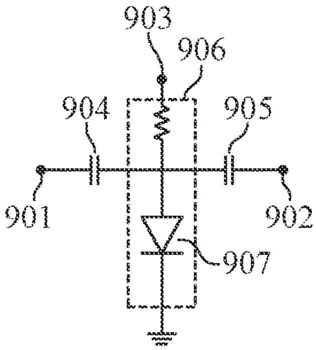
FIG. 6 illustrates a configuration of a linearizer in the distortion compensation circuit according to Embodiment 1 of the invention.

The first and second linearizers 9 and 10 generate intermodulation distortion having characteristics close to the inverse characteristics of the intermodulation distortion generated in the amplifier 13 (see FIG. 9 to be described later) disposed in the subsequent stage of the output terminal 2. As the configuration of each of the first and second linearizers 9 and 10, the circuit configuration show in FIG. 6 is considered, in which an input terminal 901, an output terminal 902, a bias terminal 903, DC cutting capacitors 904 and 905, a bias resistor 906, and a diode 907 are included. It should be noted that each of the first and second linearizers 9 and 10 may have any other circuit configuration, if it generates an intermodulation distortion close to the inverse characteristics of the intermodulation distortion generated in the amplifier, even if any difference exits such as a configuration in which a diode is not used as a shunt but is connected in series, or an element other than a diode is used.

Figure 7:
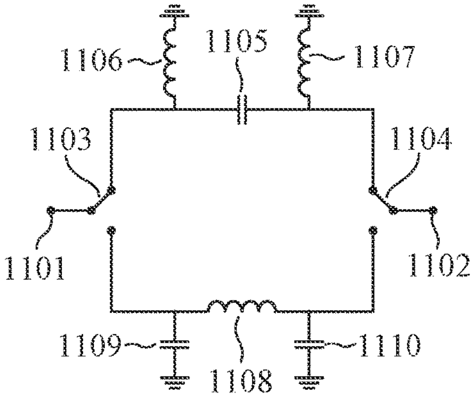
FIG. 7 illustrates a configuration of a phase shifter in the distortion compensation circuit according to Embodiment 1 of the invention.
Figure 8:
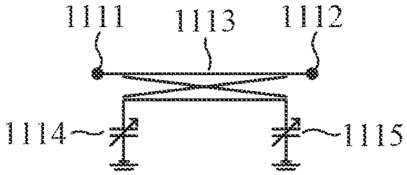
FIG. 8 illustrates another example of the configuration of the phase shifter in the distortion compensation circuit according to Embodiment 1 of the invention.

The first and second phase shifters 11 and 12 have characteristics in which the phases of signals passed through the first and second linearizers 9 and 10 can be varied at any desired angles, respectively. For each of the first and second phase shifters 11 and 12, a configuration formed by connecting the circuit shown in FIG. 7 in series may be considered, where the circuit utilizes the phase difference between the waves respectively passed through the low-pass filter and the high-pass filter. The circuit of FIG. 7 includes an input terminal 1101, an output terminal 1102, SPDT switches 1103 and 1104, a capacitor 1105, inductors 1106 and 1107, an inductor 1108, and capacitors 1109 and 1110. As another example, the circuit configuration shown in FIG. 8 in which a 90 degree-directional coupler is used may be considered, which includes an input terminal 1111, an output terminal 1112, a 90 degree-directional coupler 1113, variable reactance 1114, and variable reactance 1115. It should be noted that any other circuit configuration may be used so long as the circuit has the characteristics in which the phase of signals passed through the linearizers can be varied at any desired angle.

Figure 9:
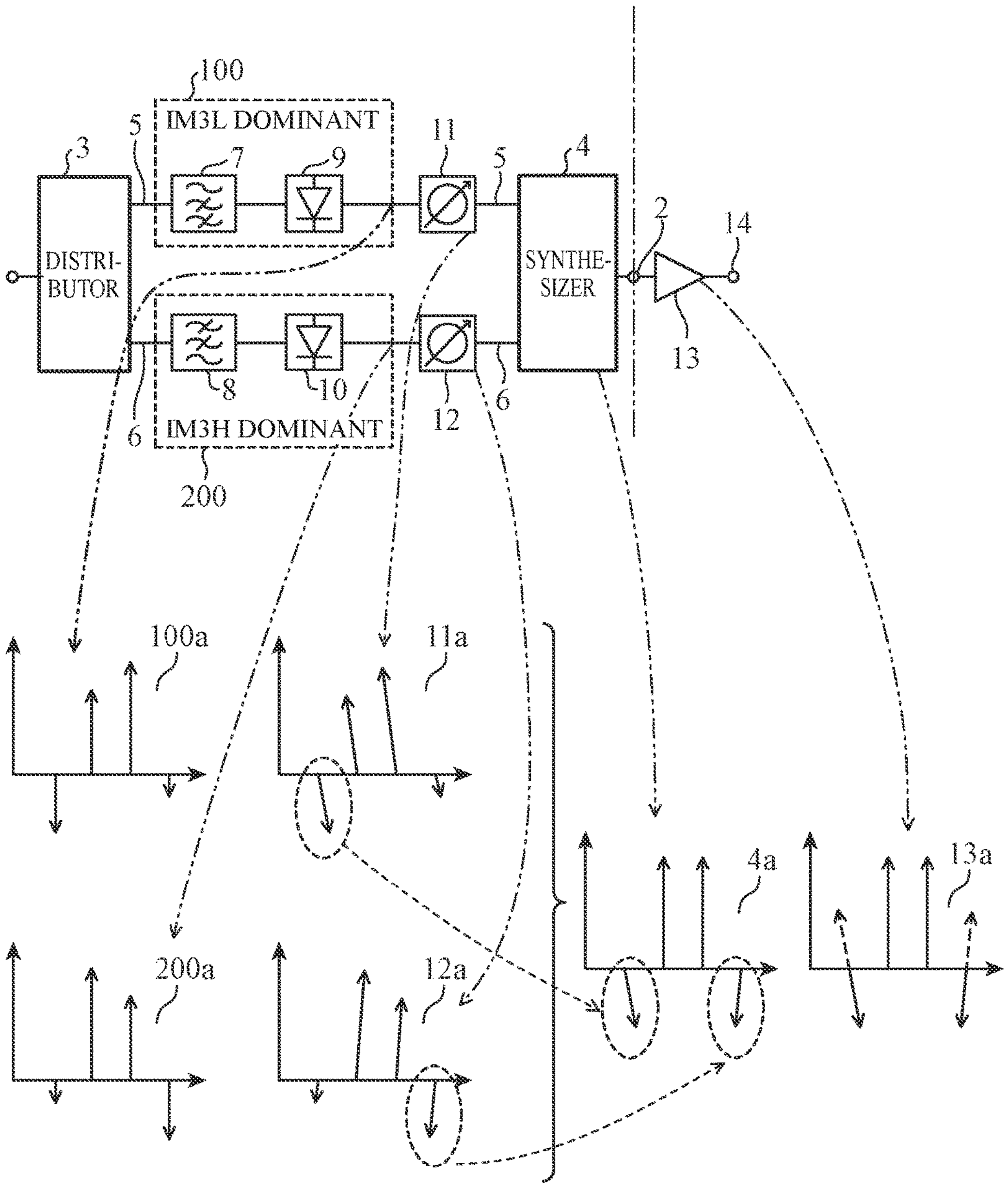
FIG. 9 is an explanatory diagram illustrating the operation of the distortion compensation circuit according to Embodiment 1 of the invention.

The operation of the distortion compensation circuit according to Embodiment 1 will now be explained with reference to the conceptual operation diagram illustrated in FIG. 9. In FIG. 9, an output terminal 2 is divided by a chain double-dashed line, and the preceding stage thereof is the distortion compensation circuit, and the subsequent stage thereof is the amplifier.

When two waves (fL, fH) of RF signals being desired waves are input from the input terminal 1, they are distributed to the first and second transmission lines 5 and 6 by the distributor 3.

The two waves of RF signals (fL, fH) input to the first transmission line 5 pass through the high-pass filter 7, which causes the attenuation of the amplitude of the low-frequency fL wave with respect to that of the high-frequency fH wave. Two waves of RF signals having a difference in amplitude are input to the first linearizer 9, which in turn generate output signals having 3rd order intermodulation distortions IM3L (in lower range) and IM3H (in higher range). At this processing, since the amplitude of fL is smaller than that of fH in the RF signals input to the first linearizer 9, an amplitude difference also occurs between the intermodulation distortions IM3L and IM3H which are generated by the mixing of fH and fL, and as represented by the output 100*a* in FIG. 9, the amplitude of IM3L becomes dominant. Namely, IM3L is generated through mixing of the second harmonic wave in the low range frequency fL with the fundamental wave in the high range frequency fH. In this case, the amplitude of the fundamental wave is basically larger than that of the second harmonic wave so that the fundamental wave is considered to have larger influence on IM3L. As a result, IM3L is largely influenced by the amplitude of fH so that, in a case where fL is small and fH is large, IM3L becomes large and IM3H becomes small. In addition, the absolute value of the amplitude of the intermodulation distortion can also be adjusted by the attenuation of the high-pass filter 7.

The phases of the RF signals being two waves and the phase of the intermodulation distortion IM3L in which the amplitude of the IM3L is dominant are rotated by the first phase shifter 11 (see an output 11*a* in FIG. 9). The values set in the first phase shifter 11 are adjusted such that the phase of the IM3L is inverse of that of the IM3L generated in the amplifier 13 disposed in the subsequent stage of the distortion compensation circuit.

The RF signals being two waves (fL, fH) input to the second transmission line 6 pass through the low-pass filter 8, in which the amplitude of the wave of the frequency fH being in a high-frequency range is attenuated in higher efficiency than that of the frequency fL being in a low-frequency range. The RF signals being two waves in which an amplitude difference is generated are input to the second linearizer 10, and in the output from the second linearizer, the 3rd order intermodulation distortion including the IM3L (low range) and the IM3H (high range) is generated. In this processing, since the amplitude of the fH wave of the RF signals input to the second linearizer 10 is smaller than that of the fL wave, an amplitude difference is also generated between the intermodulation distortion IM3L and IM3H which occur as a result of the mixing of the fH and fL waves, and as indicated by an output 200*a* of FIG. 9, the amplitude of the IM3H becomes dominant. Namely, since the IM3H is generated through mixing of the second harmonic wave of the fH wave being a high-frequency range wave and the fundamental wave of the fL wave being a low-frequency range wave, the IM3H is influenced by the amplitude of the fL wave opposed to the case of the IM3L. In addition, the absolute value of the amplitude of the intermodulation distortion can also be adjusted by the attenuation in the low-pass filter 8.

The phases of the RF signals being two waves and the phase of the intermodulation distortion in which the amplitude of the IM3H is dominant are rotated by the second phase shifter 12 (see an output 12*a* in FIG. 9). In this processing, the values set in the second phase shifter 12 are adjusted such that the phase of the IM3H is inverse of that of the IM3H generated in the amplifier 13 disposed in the subsequent stage of the distortion compensation circuit.

The synthesizer 4 synthesizes the signals from the first and second transmission lines 5 and 6 and then outputs the synthesized signal from the output terminal 2. In this processing, since the amplitude of the IM3L is dominant in the intermodulation distortion output from the first transmission line 5 and the IM3H is dominant in the intermodulation distortion output from the second transmission line 6, the phase and amplitude of the IM3L are determined in accordance with the output characteristics of the first transmission line 5, and the phase and amplitude of the IM3H are determined in accordance with the output characteristics of the second transmission line 6 (see an output 4*a* in FIG. 9).

The signals output from the distortion compensation circuit are input to the amplifier 13. The asymmetrical intermodulation distortion generated in the amplifier 13 is canceled by synthesis with the intermodulation distortion having the inverse phase which is generated in the distortion compensation circuit and whose phase and amplitude are adjusted. As a result, a signal in which the intermodulation distortion caused by the amplifier 13 is improved can be obtained from the output terminal 14.

As described above, according to Embodiment 1, the phase and amplitude of the IM3L and those of the IM3H can be individually adjusted. Therefore, it is possible to generate the intermodulation distortion that has the amplitude whose power ratio to the desired wave is same with the power ratio of the intermodulation distortion generated in the amplifier 13 to the desired wave, and has the phase inverse of that of the intermodulation distortion generated in the amplifier 13. As a result, the intermodulation distortion generated in the amplifier 13 can be reduced.

The operation of each component shown in FIG. 9 will now be described on the basis of formulas. The intermodulation distortion passed through and generated by the high-pass filter 7 and the first linearizer 9 (see the output 100*a* in FIG. 9) is expressed by:

$$IM3L = A1\cdot\cos(\omega Lt) \quad (1)$$

$$IM3H = \delta 1A1\cdot\cos(\omega Ht) \quad (2)$$

where the amplitude of the IM3L and that of the IM3H are determined in accordance with the characteristics of the high-pass filter 7. Since the amplitude of the IM3H is sufficiently smaller than the amplitude A1 of the IM3L, δ1 is smaller than 1.

The intermodulation distortion passed through the first phase shifter 11 (see the output 11*a* in FIG. 9) is expressed by:

$$IM3L = A1\cdot\cos(\omega Lt+\theta 1) \quad (3)$$

$$IM3H = \delta 1A1\cdot\cos(\omega Ht+\theta 1) \quad (4)$$

where θ1 is the phase shifted by the first phase shifter 11.

The intermodulation distortion passed through and generated by the low-pass filter 8 and the second linearizer 10 (see the output 200*a* in FIG. 9) is expressed by:

$$IM3L = \delta 2A2\cdot\cos(\omega Lt) \quad (5)$$

$$IM3H = A2\cdot\cos(\omega Ht) \quad (6)$$

where the amplitude of the IM3L and that of the IM3H are determined in accordance with the characteristics of the low-pass filter 8. Since the amplitude of the IM3L is sufficiently smaller than the amplitude A2 of the wave with IM3H, δ2 is smaller than 1.

The intermodulation distortion passed through the second phase shifter 12 (see the output 12*a* in FIG. 9) is expressed by:

$$IM3L=\delta 2A2\cdot\cos(\omega Lt+\theta 2) \quad (7)$$

$$IM3H=A2\cdot\cos(\omega Ht+\theta 2) \quad (8)$$

where θ2 is the phase shifted by the second phase shifter 12.

The signals passed through and synthesized by the synthesizer 4 are expressed by:

$$IM3L=A1\cdot\cos(\omega Lt+\theta 1)+\delta 2A2\cdot\cos(\omega Lt+\theta 2) \quad (9)$$

$$IM3H=A2\cdot\cos(\omega Ht+\theta 2)+\delta 1A1\cdot\cos(\omega Ht+\theta 1) \quad (10)$$

As indicated by the formulas (9) and (10), it can be understood that the phase and amplitude of the IM3L and IM3H can be adjusted, respectively, on the basis of the four variables (A1, A2, θ1, and θ2). For example, if δ determined on the basis of the frequency characteristics of the filter is sufficiently smaller than 1, the first term becomes dominant in each of the formulas (9) and (10); thus, the amplitude and phase of the IM3L are determined by the high-pass filter 7 and the first phase shifter 11, and those of the IM3H are determined by the low-pass filter 8 and the second phase shifter 12.

As described above, the distortion compensation circuit according to Embodiment 1 includes: a distributor distributing an input signal to a first transmission line and a second transmission line; a high-pass filter disposed on the first transmission line, having characteristics to attenuate, among input high-frequency signals being two waves, an amplitude of a signal in a low-frequency range by a set value or more with respect to an amplitude of a signal in a high-frequency range; a first linearizer connected to the high-pass filter; a first phase shifter connected to the first linearizer; a low-pass filter disposed on the second transmission line, having characteristics to attenuate, among the input high-frequency signals being two waves, an amplitude of a signal in a high-frequency range by a set value or more with respect to an amplitude of a signal in a low-frequency range; a second linearizer connected to the low-pass filter; a second phase shifter connected to the second linearizer; and a synthesizer synthesizing a signal from the first transmission line passed through the high-pass filter, the first linearizer, and the first phase shifter and a signal from the second transmission line passed through the low-pass filter, the second linearizer, and the second phase shifter. Thus, the asymmetrical intermodulation distortion generated in an amplifier can be accurately compensated.

Embodiment 2

Figure 10:
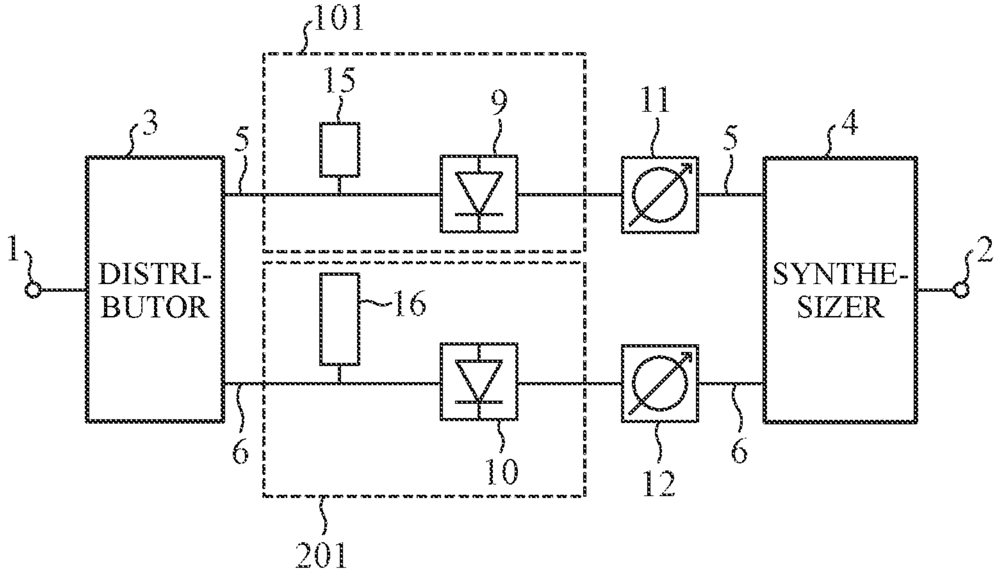
FIG. 10 is a configuration diagram illustrating a distortion compensation circuit according to Embodiment 2 of the invention.

FIG. 10 is a block diagram illustrating a distortion compensation circuit according to Embodiment 2. The distortion compensation circuit includes an input terminal 1, an output terminal 2, a distributor 3, a synthesizer 4, a first transmission line 5, a second transmission line 6, a first linearizer 9, a second linearizer 10, a first phase shifter 11, a second phase shifter 12, a low-range open stub 15, and a high-range open stub 16. Since the configurations of the components other than the low and high-range open stubs 15 and 16 are the same as those in Embodiment 1 illustrated in FIG. 1, they are denoted by the same reference numerals and the explanation thereof is omitted.

The distortion compensation circuit according to Embodiment 2 is provided with the low-range open stub 15 instead of the high-pass filter 7 and with the high-range open stub 16 instead of the low-pass filter 8. The low-range open stub 15 has characteristics in which, among two waves in input RF signals, the amplitude of the wave of the low-frequency fL is attenuated by the transmission loss of 6 dB or more with respect to that of the wave of the high-frequency fH. The high-range open stub 16 has characteristics in which, among two waves in input Rf signals, the amplitude of the wave of the high-frequency fH is attenuated by 6 dB or more with respect to that of the wave of the low-frequency fL. The low-range open stub 15 and the first linearizer 9 compose a first adjustment circuit 101, and the high-range open stub 16 and the second linearizer 10 compose a second adjustment circuit 201.

The operations of the distortion compensation circuit according to Embodiment 2 are basically the same as those according to Embodiment 1 except for the low-range and high-range open stubs 15 and 16 performing the same operations as the high-pass and low-pass filters 7 and 8 in Embodiment 1 so that the explanation thereof is omitted.

As described above, the distortion compensation circuit according to Embodiment 2 includes: a distributor distributing an input signal to two transmission lines; a low-range open stub connected to a first transmission line being connected to one of outputs of the distributor, having characteristics to attenuate, among input high-frequency signals being two waves, an amplitude of a signal in a low-frequency range by a set value or more with respect to an amplitude of a signal in a high-frequency range; a first linearizer connected to the low-range open stub; a first phase shifter connected to the first linearizer; a high-range open stub connected to a second transmission line being connected to another one of outputs of the distributor, having characteristics to attenuate, among the input high-frequency signals being two waves, an amplitude of a signal in a high-frequency range by a set value or more with respect to an amplitude of a signal in a low-frequency range; a second linearizer connected to the high-range open stub; a second phase shifter connected to the second linearizer; and a synthesizer synthesizing a signal from the first transmission line passed through the low-range open stub, the first linearizer, and the first phase shifter and a signal from the second transmission line passed through the high-range open stub, the second linearizer, and the second phase shifter. Thus, the asymmetrical intermodulation distortion generated in an amplifier can be accurately compensated. Further, since the amplitude modulation means can be configured only by open stubs, the size of the distortion compensation circuit can be reduced.

Embodiment 3

Figure 11:
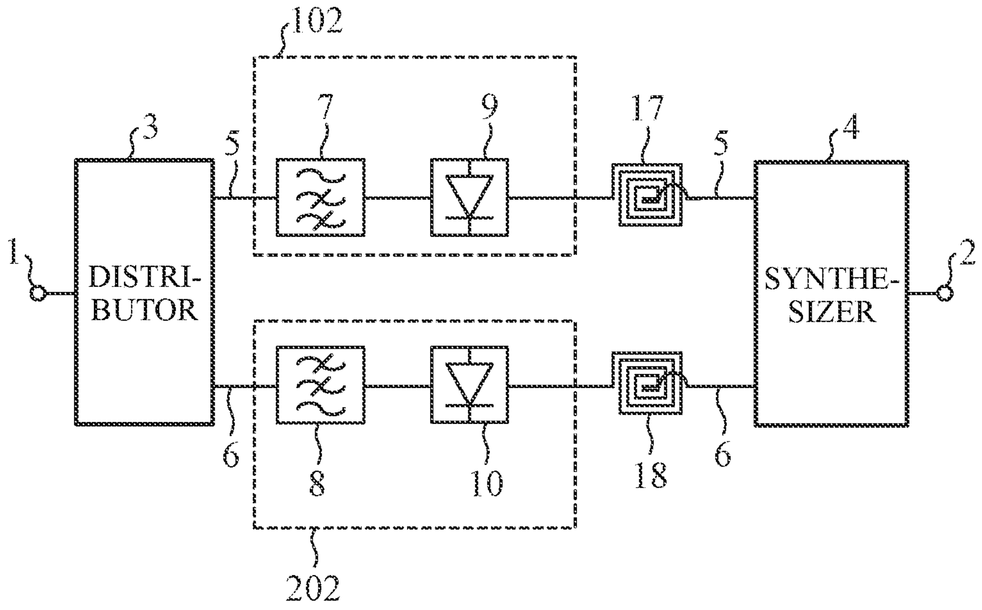
FIG. 11 is a configuration diagram illustrating a distortion compensation circuit according to Embodiment 3 of the invention.

FIG. 11 is a block diagram illustrating a distortion compensation circuit according to Embodiment 3. The distortion compensation circuit includes an input terminal 1, an output terminal 2, a distributor 3, a synthesizer 4, a first transmission line 5, a second transmission line 6, a high-pass filter 7, a low-pass filter 8, a first linearizer 9, a second linearizer 10, a first phase adjustment line 17, and a second phase adjustment line 18. Since the configurations of the components other than the first and second phase adjustment lines 17 and 18 are the same as those in Embodiment 1 illustrated in FIG. 1, they are denoted by the same reference numerals and the explanation thereof is omitted.

The distortion compensation circuit according to Embodiment 3 is provided with the first and second phase adjustment lines 17 and 18 instead of the first and second phase shifters 11 and 12 of Embodiment 1. The first and second phase adjustment lines 17 and 18 include transmission lines, respectively, each having any desired length and can vary the phases of signals passed through the first linearizer 9 and the second linearizer 10 in accordance with the electrical lengths of the transmission lines.

The operation of the distortion compensation circuit according to Embodiment 3 will now be explained. The operation of the distortion compensation circuit is basically the same as that of Embodiment 1 except for the phase adjustment operation performed by the first and second phase adjustment lines 17 and 18. In the phase shifters used as the phase adjustment means in Embodiment 1, the same phase shift is generated for the RF signals being two waves (fL, fH) and for the intermodulation distortion (IM3L, IM3H). On the other hand, when the first and second phase adjustment lines 17 and 18 in Embodiment 3 are used for the phase adjustment means, since the electrical length of the phase adjustment line of a signal whose frequency is higher than that of other signals, among the RF signals being two waves (fL, fH) and the intermodulation distortion (IM3L, IM3H), becomes relatively long to that of the other signals, the phase of the signal largely rotates.

In a case where the frequency deviation in the RF signals being two waves (fL, fH) increase, the difference in frequency of the intermodulation distortion (IM3L and IM3H) also increases. On the other hand, regarding the asymmetrical intermodulation distortion generated in an amplifier, the larger the frequency deviation is, the larger the difference in phases of the intermodulation distortion (IM3L, IM3H) becomes. Namely, when the frequency deviation increases, the difference in phases of the intermodulation distortion (IM3L, IM3H) in the amplifier also increases, resulting in a larger difference in phases of the intermodulation distortion (IM3L, IM3H) in the distortion compensation circuit. Hence, when the first and second phase adjustment lines 17 and 18 are used, the asymmetrical intermodulation distortion can be compensated in a broader band.

In this embodiment, the first phase adjustment line 17 and the second phase adjustment line 18 are connected to the first transmission line 5 and the second transmission line 6, respectively. Alternatively, for example, the first transmission line 5 may be connected to a phase shifter, and the second transmission line 6 may be connected to a phase adjustment line, or vice versa. Further, a circuit configured by serially connecting a phase shifter and a phase adjustment line may be used for at least one of the first transmission line 5 and the second transmission line 6 as a phase adjustment means.

As described above, according to the distortion compensation circuit of Embodiment 3, instead of at least one of the first phase shifter and the second phase shifter, a phase adjustment line for adjusting the phase of a signal is connected. Thus, the asymmetrical intermodulation distortion generated in an amplifier can be accurately compensated in a broader band.

Further, according to the distortion compensation circuit of Embodiment 3, instead of at least one of the first phase shifter and the second phase shifter, a circuit configured by serially connecting a phase shifter and a phase adjustment line is provided, and the phase of a signal is adjusted by the circuit. Thus, the asymmetrical intermodulation distortion generated in an amplifier can be accurately compensated in a broader band.

Embodiment 4

Figure 12:
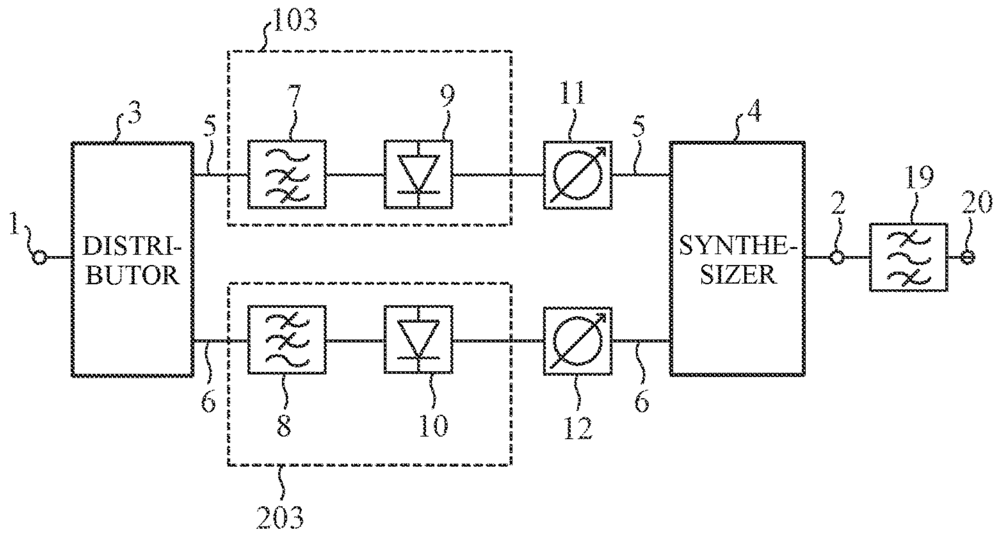
FIG. 12 is a configuration diagram illustrating a distortion compensation circuit according to Embodiment 4 of the invention.

FIG. 12 is a block diagram of a distortion compensation circuit according to Embodiment 4 of the present invention. The distortion compensation circuit includes an input terminal 1, an output terminal 2, a distributor 3, a synthesizer 4, a first transmission line 5, a second transmission line 6, a high-pass filter 7, a low-pass filter 8, a first linearizer 9, a second linearizer 10, a first phase shifter 11, a second phase shifter 12, a filter circuit 19, and a filter output terminal 20. The configurations of components other than the filter circuit 19 and the filter output terminal 20 are the same as those of Embodiment 1 illustrated in FIG. 1 so that these components are denoted by the same reference numerals and the explanation thereof is omitted.

The distortion compensation circuit of Embodiment 4 is provided with the filter circuit 19 provided on the output terminal 2 of the distortion compensation circuit according to Embodiment 1, and the output of the filter circuit 19 is output from the filter output terminal 20. The filter circuit 19 has characteristics to flatten the amplitude of the desired wave from the output terminal 2 with respect to the frequencies.

The operation of the distortion compensation circuit according to Embodiment 4 will now be explained. The operational flow of the processing up to the output terminal 2 is the same as that in Embodiment 1.

In the circuit of Embodiment 1, since desired waves pass through the high-pass and low-pass filters 7 and 8 on the first and second transmission lines 5 and 6, respectively, a proper frequency characteristics is generated in the desired waves being output from the output terminal 2. For example, among two waves of RF signals (fL, fH), which originally have the same amplitude, there is a case that the amplitude of the wave of the low range frequency fL becomes smaller than that of the high range frequency fH. In such a case, in Embodiment 4, the filter circuit 19 is provided with the function of a low-pass filter to flatten the amplitude of the fH wave and that of the fL wave. For the case of the inverse characteristics, the filter circuit 19 is provided with the function of a high-pass filter.

Further, when signals over a certain band range are input to a distortion compensation circuit, there is a case that the amplitude of the desired wave at the center frequency becomes smaller than the amplitudes of the desired wave at the ends of the band range. In such a case, in Embodiment 4, the filter circuit 19 is provided with the function of a band pass filter to flatten the amplitude over the band range. For the case of inverse characteristics, the filter circuit 19 is provided with the function of a band rejection filter.

Note that, in the above example, the filter circuit 19 is applied to the configuration of Embodiment 1. Alternatively, the filter circuit 19 may be applied to the configuration of Embodiment 2 or Embodiment 3.

As described above, since the distortion compensation circuit according to Embodiment 4 includes a filter circuit connected to an output terminal of the synthesizer and correcting frequency characteristics of a desired wave, the asymmetrical intermodulation distortion generated in an amplifier can be accurately compensated.

It should be noted that the invention according to the present application can include any combination of embodiments, or modification or omission of any component in each embodiment within the scope of the invention.

In addition, any concentrated constant component in the distortion compensation circuits according to Embodiments 1 to 4 can be replaced with an equivalent distributed constant line.

INDUSTRIAL APPLICABILITY

As described above, the present invention relates to a distortion compensation circuit for reducing intermodulation distortion generated in an amplifier or the like. The distortion compensation circuit according to the invention is suitable to, for example, use in a high-frequency amplifier.

REFERENCE SIGNS LIST

1 input terminal
2, 14 output terminal
3 distributor
4 synthesizer
5 first transmission line
6 second transmission line
7 high-pass filter
8 low-pass filter
9 first linearizer
10 second linearizer
11 first phase shifter
12 second phase shifter
13 amplifier
15 low-range open stub
16 high-range open stub
17 first phase adjustment line
18 second phase adjustment line
19 filter circuit
20 filter output terminal

The invention claimed is:

1. A distortion compensation circuit comprising:

a distributor distributing an input signal to a first transmission line and a second transmission line;

a high-pass filter disposed on the first transmission line, having characteristics to attenuate, among input high-frequency signals being two waves, an amplitude of a signal in a low-frequency range by a set value or more with respect to an amplitude of a signal in a high-frequency range;

a first linearizer connected to the high-pass filter;

a first phase shifter connected to the first linearizer;

a low-pass filter disposed on the second transmission line, having characteristics to attenuate, among the input high-frequency signals being two waves, an amplitude of a signal in a high-frequency range by a set value or more with respect to an amplitude of a signal in a low-frequency range;

a second linearizer connected to the low-pass filter;

a second phase shifter connected to the second linearizer; and a synthesizer synthesizing a signal from the first transmission line passed through the high-pass filter, the first linearizer, and the first phase shifter and a signal from the second transmission line passed through the low-pass filter, the second linearizer, and the second phase shifter.

2. The distortion compensation circuit according to claim 1, comprising a phase adjustment line varying a phase of a signal instead of at least one of the first phase shifter and the second phase shifter.

3. The distortion compensation circuit according to claim 1, comprising a serial connection circuit of a phase shifter and a phase adjustment line which varies a phase of a signal instead of at least one of the first phase shifter and the second phase shifter.

4. The distortion compensation circuit according to claim 1, further comprising a filter circuit connected to an output terminal of the synthesizer and correcting frequency characteristics of a desired wave.

5. The distortion compensation circuit according to claim 1, wherein any component in the distortion compensation circuit may be configured by any of a concentrated constant circuit and a distributed constant circuit.

6. A distortion compensation circuit comprising:

a distributor distributing an input signal to a first transmission line and a second transmission line;

a low-range open stub disposed on the first transmission line, having characteristics to attenuate, among input high-frequency signals being two waves, an amplitude of a signal in a low-frequency range by a set value or more with respect to an amplitude of a signal in a high-frequency range;

a first linearizer connected to the low-range open stub;

a first phase shifter connected to the first linearizer;

a high-range open stub disposed on the second transmission line, having characteristics to attenuate, among the input high-frequency signals being two waves, an amplitude of a signal in a high-frequency range by a set value or more with respect to an amplitude of a signal in a low-frequency range;

a second linearizer connected to the high-range open stub;

a second phase shifter connected to the second linearizer; and a synthesizer synthesizing a signal from the first transmission line passed through the low-range open stub, the first linearizer, and the first phase shifter and a signal from the second transmission line passed through the high-range open stub, the second linearizer, and the second phase shifter.

* * * * *